United States Patent [19]

Fujiwara et al.

[11] 4,454,444
[45] Jun. 12, 1984

[54] LiTaO₃ PIEZOELECTRIC RESONATOR

[75] Inventors: Yoshiro Fujiwara; Sumio Yamada; Hiroshi Hoshino; Noboru Wakatsuki, all of Kawasaki, Japan

[73] Assignee: Fujitsu Limited, Kawasaki, Japan

[21] Appl. No.: 467,810

[22] Filed: Feb. 18, 1983

[30] Foreign Application Priority Data

Feb. 22, 1982 [JP] Japan .................................. 57-25993
Apr. 20, 1982 [JP] Japan .................................. 57-65945
Apr. 28, 1982 [JP] Japan .................................. 57-72450
Jul. 7, 1982 [JP] Japan .................................. 57-117999

[51] Int. Cl.³ .......................................... H01L 41/08
[52] U.S. Cl. .................................. 310/360; 310/368; 310/348
[58] Field of Search ................ 310/360, 361, 368, 348

[56]  References Cited

U.S. PATENT DOCUMENTS 3,525,885  8/1970  Ballman et al. .................... 310/360

FOREIGN PATENT DOCUMENTS 54-68194  6/1979  Japan ................................. 310/360

OTHER PUBLICATIONS

Low Frequency Resonatore of Lithium Tantalate, by M. Onoe, Proceedings, 27th Ann. Frequency Control Symposium, Cherry Hill, N.J., USA, Jun. 12–14, 1973, pp. 42–49.

Primary Examiner—Mark O. Budd
Attorney, Agent, or Firm—Staas & Halsey

[57]  ABSTRACT

A piezoelectric resonator which resonates in thickness shear mode. The piezoelectric resonator includes a strip shaped resonance chip made of an X-cut plate of lithium tantalate crystal and having a rectangular cross-section. Electrodes are formed at the center portion with respect to the longitudinal direction of the resonance chip on each of two X-plane surfaces. The width of the electrodes is equal to the width of the resonance chip. The longitudinal direction of the resonance chip inclines with respect to the Y-axis by an angle of 50°±2′ in the clockwise direction in the X-plane so as to make the longitudinal direction of the resonance chip coincide with the displacement direction of primary oscillation of the crystal. Optimal ratios of the dimensions of the resonance chip and terminal connectors at the ends of the resonance chip are given to reduce spurious response. The temperature characteristic is optimized by selecting rotation angles about the Y- and Z-axes in relation to the amount of trapped energy.

11 Claims, 25 Drawing Figures

LITAO₃ PIEZOELECTRIC RESONATOR

BACKGROUND OF THE INVENTION

1. Field of the Invention

The present invention relates to a piezoelectric resonator of high electro-mechanical coupling comprising an X-cut plate of lithium tantalate (LiTaO₃) crystal. The X-cut plate is a crystal plate which is perpendicular to the X-axis of the crystal. Such an X-cut plate includes a plate which is rotated about the Y-axis and/or Z-axis of the crystal.

2. Description of the Prior Art

Piezoelectric resonators comprise a plate of piezoelectric material such as crystal or lithium tantalate and an electrode film coated upon the upper and lower main surfaces of the plate. When an alternating (a.c.) electric field is applied between the electrode films, the piezoelectric plate is subject to stress of a frequency equal to that of the a.c. electric field. One kind of vibrating stress is called thickness shear mode. When the frequency of the a.c. electric field coincides with the inherent resonance frequency of the piezoelectric plate, electric resonance occurs, resulting in greater oscillation.

Oscillating devices comprising such piezoelectric resonators are widely used in oscillators or filters of communication apparatus due to their compactness, high reliability, and high stability of oscillation frequency. Recently, single-mode resonators in which spurious responses are eliminated and multi-mode filters have been developed wherein the oscillation energy is trapped or concentrated in the vicinity of the electrodes by the mass load effect and the piezoelectric reaction.

In a prior art, LiTaO₃ piezoelectric resonator, spurious response was generated in the vicinity of the inherent frequency of the resonator, resulting in degradation of the resonator. The quality factor Q, which corresponds to the stability of frequency of oscillation, was also low in the prior art resonator. Further, in the prior art resonator, it was attempted to minimize fluctuations of frequency with respect to the change of temperature so as to obtain stable temperature characteristics by selection of the cutting direction of the piezoelectric plate with respect to the crystal orientation. However, it is not easy to determine the optimal cutting direction and it is difficult to obtain a single mode resonator in which spurious responses are eliminated.

SUMMARY OF THE INVENTION

The present invention was made considering the above-mentioned problems of the prior art. It is an object of the present invention to provide a piezoelectric resonator of lithium tantalate (LiTaO₃), in which spurious responses are eliminated and the quality factor Q upgraded and in which desirable temperature characteristic can be obtained.

A piezoelectric resonator in thickness shear mode oscillation according to the present invention comprises a bar-like resonance chip made of an X-cut plate of lithium tantalate crystal and having a rectangular cross-section. An electrode film is formed at the center portion of the chip with respect to the longitudinal direction on each of two surfaces parallel to the X-plane (i.e., the plane perpendicular to the X-axis of the crystal) of the chip. The width of the electrode film is equal to the width of the chip. The longitudinal direction of the chip inclines with respect to the Y-axis by an angle of 50°±2° in the clockwise direction in the X-plane so as to make the longitudinal direction of the chip coincide with the oscillating direction of the main oscillation of the crystal.

BRIEF DESCRIPTION OF THE DRAWINGS

The present invention will now be described with reference to the accompanying drawings, in which.

DESCRIPTION OF THE PREFERRED EMBODIMENTS

Figure 1:
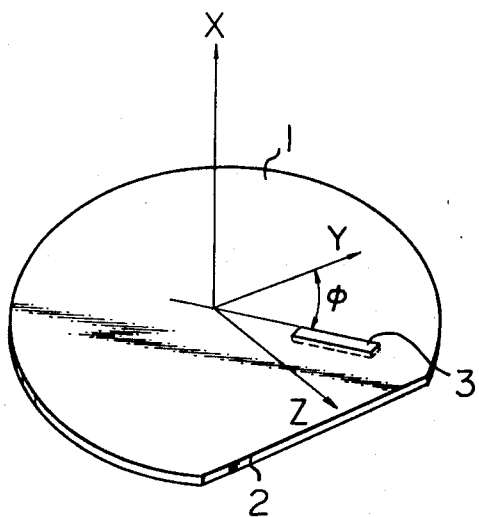
FIG. 1 is a perspective view of a wafer of LiTaO₃ crystal.

A wafer 1 illustrated in FIG. 1 is formed by cutting a crystal of lithium tantalate. The wafer 1 is an X-cut plate, i.e., a plate whose main surfaces are perpendicular or nearly perpendicular to the X-axis of the crystal. The crystal of the X-cut plate may be rotated about the Y-axis and/or Z-axis. The wafer 1 has an edge 2 for positioning the wafer 1 at the time of cutting. The edge 2 is perpendicular to the Z-axis so that the wafer 1 can be easily positioned at a desired angle with respect to the crystal orientation. The Y-axis is parallel to the edge 2. A number of resonance chips 3 of a longitudinal box or rectangular prism shape are cut from the wafer 1 so the axes of the prisms are parallel.

A pair of electrodes 4 and 4' (FIG. 2) are formed on the X planes, i.e., the planes perpendicular to the X-axis, of the bar-shaped resonance chip 3. The width of the electrode is equal to the width W of the resonance chip 3. When a high frequency voltage is applied to the pair of electrodes 4 and 4', thickness shear mode oscillation is generated as shown by arrows in FIG. 2. The magnitude of such thickness shear mode oscillation is maximum at the center of the resonance chip 3 and minimum at the ends, as shown in FIG. 3.

The upper electrode 4 is connected to a terminal (not shown) at an end of the resonance chip 3 through a lead 4a. The lower electrode 4' is connected to another terminal (not shown) at the other end of the resonance chip 3 through another lead.

Length L, width W, and thickness H of the rectangular-strip-shaped resonance chip 3 are determined as follows. Width W is made about 1.5 times larger than thickness H so that unnecessary responses generated within the resonance chip 3 do not affect the resonance of thickness shear mode oscillation. Width of the electrode 4 is made equal to the width W of the resonance chip 3 to equalize the energy of resonance in the transverse direction of the resonance chip 3 and prevent waves reflected from the sides of the resonance chip 3 from affecting the primary resonance oscillation. Since the width of the resonance chip 3 need only be the same as the width of the electrode 4, the resonator may be made narrower in width and more compact.

It is desirable that length L be more than 10 times larger than thickness H so that the energy of oscillation is efficiently concentrated and trapped between the pair of electrodes 4 and 4' disposed at the center of the resonance chip 3. With such dimensions of the resonance chip 3, energy which is transmitted to the resonance ends of the chip 3 can be minimized so that waves reflected upon the end surfaces of the resonance chip 3 do not affect the main resonance. Also, with such dimensions, the resonance chip 3 can be held at the ends thereof since the acoustic energy is minimized there.

The thickness shear mode resonances in the X-cut plate include a fast mode and a slow mode. The displacement directions of the fast and the slow shear waves are perpendicular to each other and constant with respect to the Y-axis of the crystal. The shear wave of the fast mode is used as the main resonance since the electro-mechanical coupling of the fast mode is very large. The orientation of the crystal of the resonance chip 3 is arranged so that the direction of the fast mode (shown by arrows in FIG. 2) coincides with the longitudinal direction of the chip 3. That is, the cutting direction of the resonance chip 3 in the wafer 1 is determined so that the angle $\phi$ (FIG. 1) between the resonance Y-axis and the longitudinal direction of the chip 3 is equal to the constant angle between the Y-axis and the fast displacement direction of the thickness shear mode oscillation.

Figure 5:
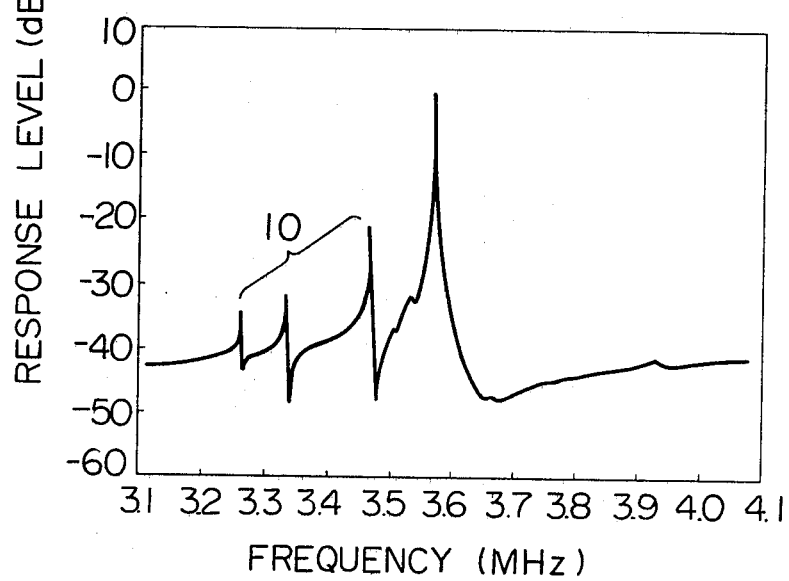
FIG. 5 is a graphic view of the frequency characteristic of a resonator of the prior art.

The angle between Y-axis and the displacement direction of the thickness shear mode oscillation of the piezoelectric resonator of the X-cut plate of lithium tantalate, i.e., angle $\phi$ in FIG. 1, has been suggested to be $-53°$ in the prior art (NDK technical report No. 6 '79, 11 "Oscillator Controlled by Electric Voltage Using Lithium Tantalate Resonator", Nippon Dempa Kogyo). However, a resonance chip having this angle generates spurious response 10 as can be seen in the graph of the frequency characteristic of such a resonance chip in FIG. 5.

Figure 7:
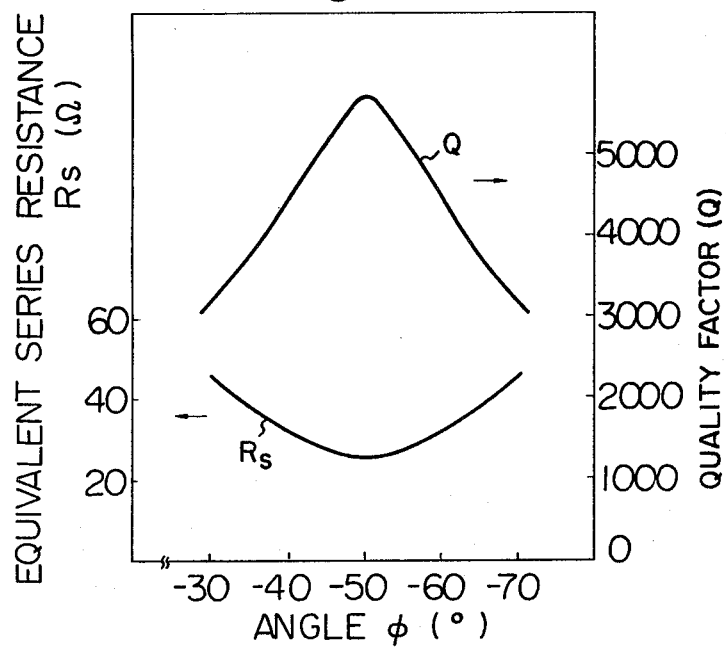
FIG. 7 is a graphic view of an equivalent series resistance $R_S$ and a quality factor Q of a resonator of LiTaO₃ with respect to a cutting angle $\phi$.

FIG. 7 represents experimental data of the relationship of equivalent series resistance $R_S$ and quality factor Q with respect to the angle between the longitudinal direction of the resonance chip and the Y-axis of the X-cut plate of the crystal of lithium tantalate.

If the equivalent series resistance $R_S$ is large, the magnitude of displacement is small. The quality factor Q corresponds to the stability of the resonance frequency. Therefore, it is desirable that the quality factor Q be high and the equivalent series resistance $R_S$ be low.

In FIG. 7, the abscissa represents the angle $\phi$, the left ordinate represents the equivalent series resistance $R_S$, and the right ordinate represents the quality factor Q. The curve labelled $R_S$ represents the relationship between the angle $\phi$ and the equivalent series resistance $R_S$. The curve labelled Q represents the relationship between the angle $\phi$ and the quality factor Q. As can be seen from the graph in FIG. 7, the equivalent series resistance $R_S$ is minimum when the angle $\phi = -50°$. ALso, the quality factor Q is maximum at that angle. Therefore, considering the allowance of $\pm 2°$, in the present invention, the angle $\phi$ is determined to be $-50° \pm 2°$.

Figure 6:
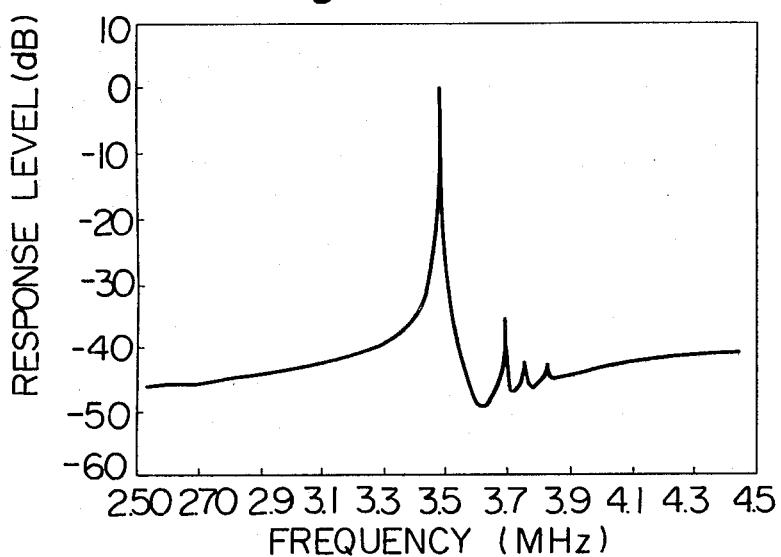
FIG. 6 is a graphic view of the frequency characteristic of a resonator of the present invention.

FIG. 6 is a graphic view of admittance (frequency characteristic) as obtained from an experiment using a resonance chip 3 of 8 mm length, 0.5 mm thickness, 1.35 mm width and having $\phi = -50°$. As can be seen from FIG. 6, the frequency characteristic of the resonance chip 3 according to the present invention has less spurious response than the characteristic of the prior art represented in FIG. 5.

Figure 4:
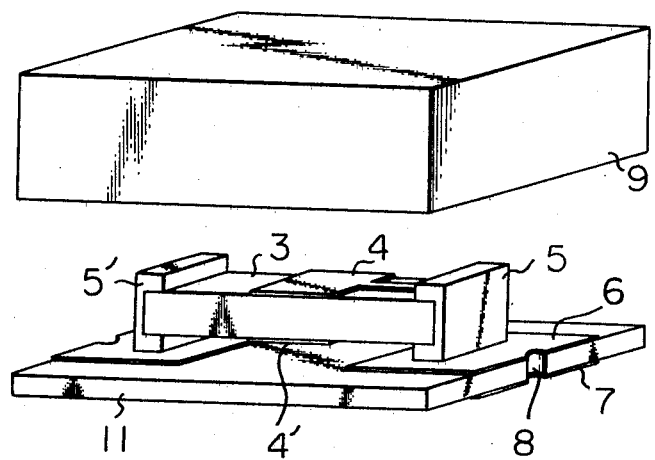
FIG. 4 is a perspective view of a resonator comprising the resonance chip of FIG. 2.

The resonance chip 3 of the present invention is assembled as a chip resonator as shown in FIG. 4. The ends of the resonance chip 3 are held by electrode terminals 5 and 5', respectively. The electrode terminals 5 and 5' are connected to the electrodes 4 and 4', formed on the upper and lower surfaces of the center portion of the resonance chip 3, respectively. The electrode terminal 5 is connected to a thick film electrode 6 formed on the upper surface of a ceramic base 11. The thick film electrode 6 is connected to another thick film electrode 7 formed in the lower surface of the ceramic base 11, through a through hole 8, the inside surface of which is coated with a conductor. The electrode terminal 5' has similar connections on the opposite side of the resonance chip 3. This ceramic base 11 is covered by a ceramic cap 9 so as to form a chip resonator. Such a chip resonator is directly mounted on a printed board and constitutes various electrical circuits by connecting the thick film electrode 7 and the printed pattern of the printed board. A lead terminal which projects under the ceramic base 11 may be provided instead of the thick film electrode 7.

The temperature characteristic of the resonator will be described hereinafter. A resonator must generate resonance at a stable frequency irrespective changes of in ambient temperature. The present inventors found that the temperature characteristics of a resonator depend upon the orientation of the crystal and energy trapped within the resonance chip 3. On the basis of this discovery, they improved the temperature characteristics of a resonator by selecting the optimal relationship for the parameters. They thus provided a resonator in which the temperature characteristics are upgraded and spurious responses are eliminated.

Figure 8:
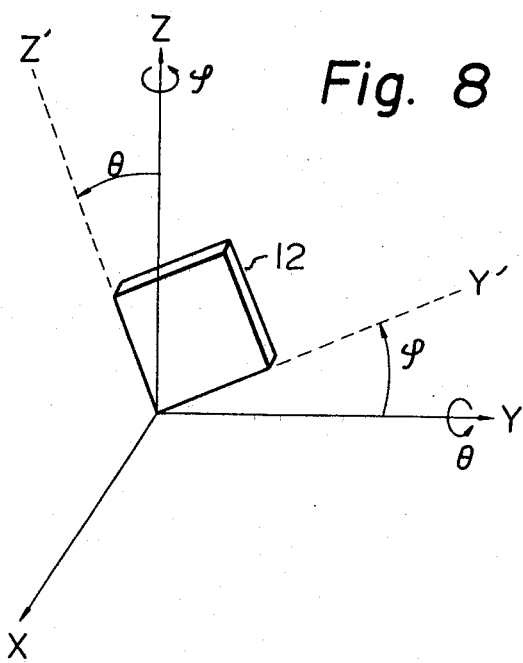
FIG. 8 is an explanatory view of a double-rotation-cut plate.

FIG. 8 shows an X-cut plate of double rotation, in which the plate is rotated about the Y-axis by angle $\theta$ and about the Z-axis by angle $\phi$. The influence of temperature change upon the resonance frequency mainly depends upon the primary temperature coefficient of the resonance chip 3. If the temperature characteristic of the resonance chip 3 is to be upgraded, the primary temperature coefficient thereof should be zero.

Figure 9:
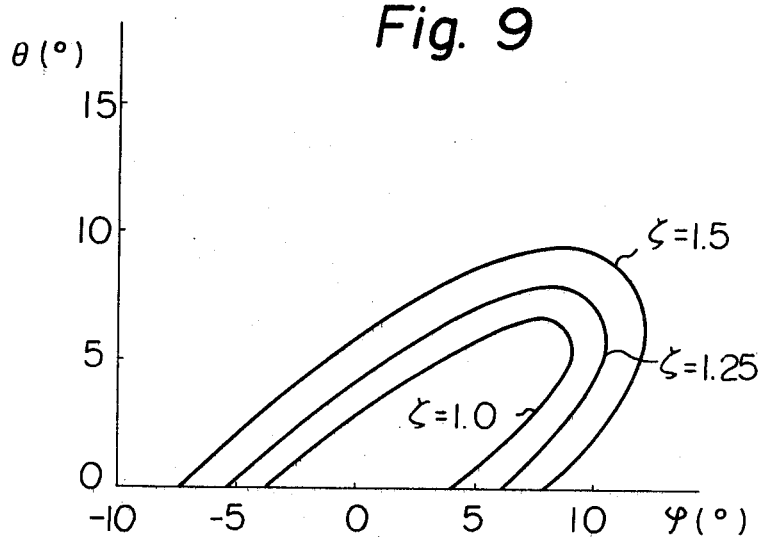
FIG. 9 is a graphic view of the relationship between the trapped energy and the rotational angle with respect to the Y-axis and Z-axis, in which the primary temperature coefficient is zero.

FIG. 9 is a graphic view of the relationship between the orientation of the crystal and the trapped energy $\zeta$, with respect to a strip-shaped resonance chip of a double-rotation X-cut plate which has a primary temperature coefficient of zero. For example, for a resonance chip of $\zeta=1.5$, the primary temperature coefficient is zero if $\theta$ and $\zeta$ satisfy the relationship graphically represented by the graph of $\zeta=1.5$ in FIG. 9.

Figure 2:
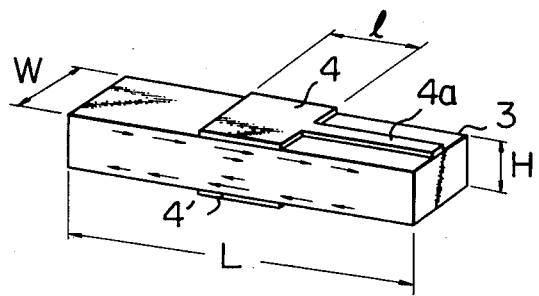
FIG. 2 is a perspective view of a resonance chip cut from the wafer of FIG. 1.
Figure 3:
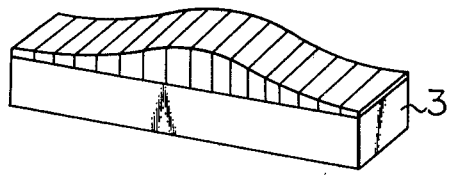
FIG. 3 is an explanatory view showing the distribution of the oscillation energy of the resonance chip.

With respect to the strip shaped chip as shown in FIG. 2, the trapped energy $\zeta$ is defined as follows.

$$\zeta = l/H \sqrt{(fa - fe)/fa} \quad (a)$$

wherein l: length of the electrode
H: thickness of the resonance chip
fe: cut-off frequency at the portion of electrode
fa: cut-off frequency at the portion without electrode As for the X-cut plate of lithium tantalate, $(fa-fe)/fa=0.1$. Therefore, $\zeta$ depends upon $l/H$.

When $\theta$ and $\phi$ are to be determined from the graph of FIG. 9, the optional $\theta$ and $\phi$ must be chosen considering the condition of $\zeta$ so that the single mode resonance can be obtained.

Figure 10:
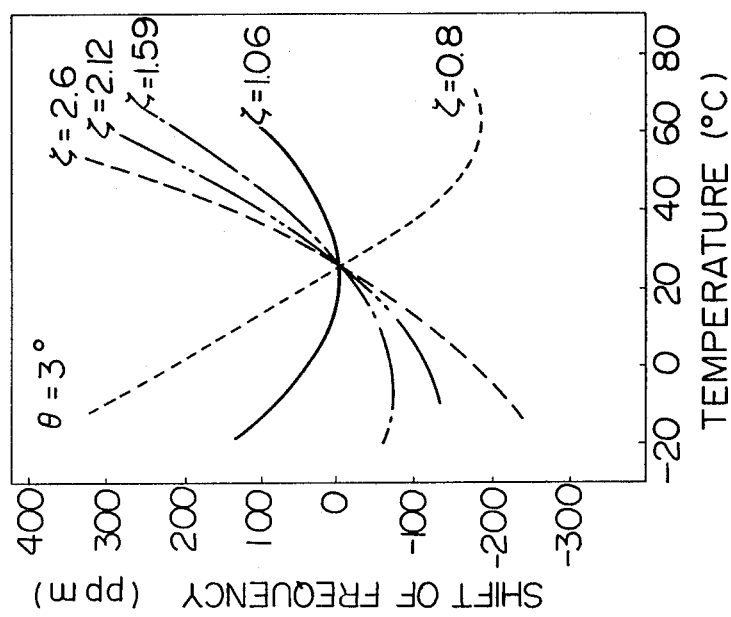
FIG. 10 is a graphic view of the temperature characteristic of the resonator of cutting direction $\theta = 3°$ and $\phi = 0°$, showing the shift of frequency when the trapped energy of the resonator is changed.

In FIG. 10, the abscissa represents the ambient temperature (°C.) and the ordinate represents the shift of resonance frequency (ppm). The shift of resonance frequency is represented by $\Delta fr/fr$, in which fr is the resonance frequency of the specimen (resonance chip) used in the experiment and $\Delta fr$ is the shifted amount of resonance frequency in response to the change of temperature. Each graph represents the temperature characteristic of different trapped energy $\zeta$. The trapped energy $\zeta$ is changed by changing the length l of the electrode. Five kinds of specimens of $\zeta=2.65, 2.12, 1.59, 1.06,$ and 0.8 were used in the experiment. The X-cut plate used in the experiment was a 3° Y-X-cut plate rotated about the Y-axis by an angle $\theta$ of 3°. As can be seen from FIG. 10, the temperature characteristic of the specimen of $\zeta=1.06$ is the most optimum, since the turning point is about 25° C., which is about normal room temperature, and the change of shift of frequency is minimized at that temperature. The turning point is higher than 25° C. when $\zeta$ of the specimen is smaller than 1.06. The turning point is lower when $\zeta$ is increased.

Figure 11:
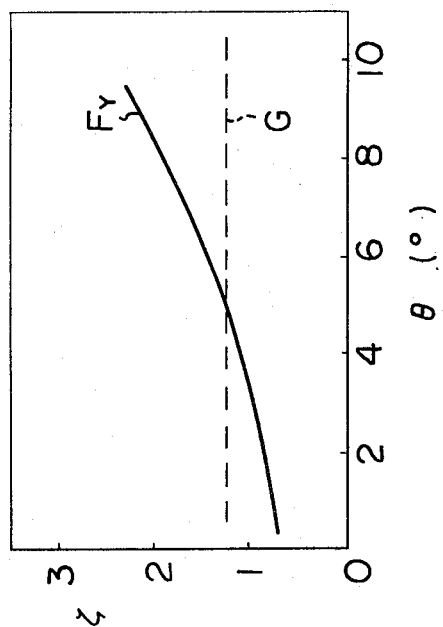
FIG. 11 is a graphic view of the relationship between the rotational angle $\theta$ and the trapped energy $\zeta$.

In FIG. 11, the abscissa represents the rotated angle of the resonance chip of the X-cut plate of lithium tantalate about the Y-axis of the crystal. The ordinate represents the trapped energy $\zeta$. Curve $F_Y$ represents the relationship between the angle $\theta$ and the enclosed energy $\zeta$, in which the turning point of the temperature characteristic of the resonance chip is about normal room temperature (23° C.). The dotted line G represents the maximum value of the trapped energy $\zeta$ required for the single mode resonance of the strip shaped chip of lithium tantalate, which are experimentally examined at 3.6 MHz.

FIG. 11 shows that the curve $F_Y$ can be represented by the formula $\zeta=\frac{1}{8}\cdot\theta+0.65$ in the region where the trapped energy $\zeta$ is less than 1.25 at room temperature. If the circumferential temperature of the resonance chip is within the range of the normal room temperature $\pm 5°$ C., then graph $F_Y$ can be represented by the formula $\zeta=\frac{1}{8}\cdot\theta+(0.65\pm0.1)$.

Figure 13:
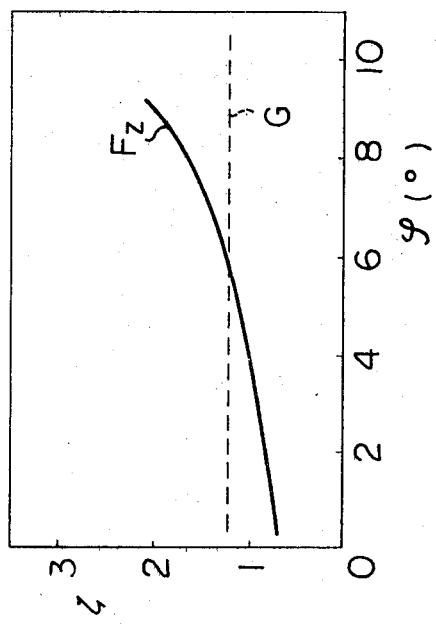
FIG. 13 is a graphic view of the relationship between the rotational angle $\phi$ and the trapped energy $\zeta$.
Figure 12:
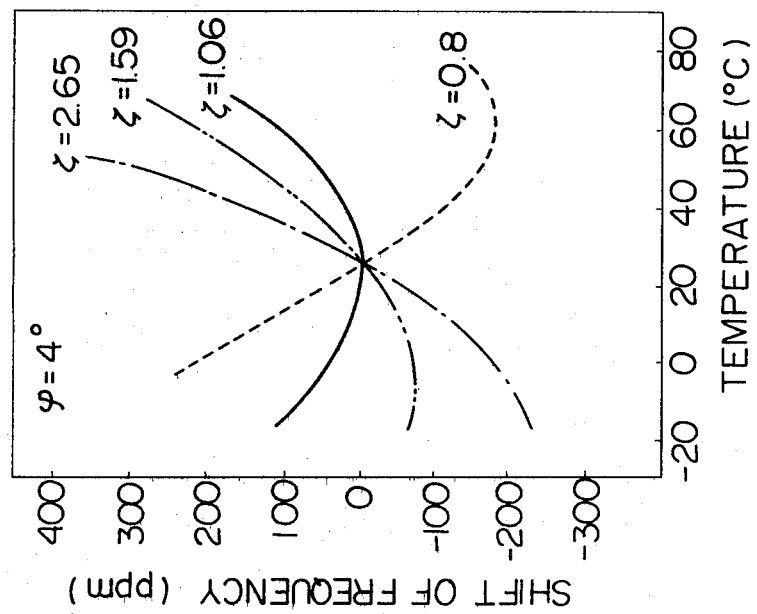
FIG. 12 is a graphic view of the temperature characteristic of the resonator of cutting direction $\theta = 0°$ and $\phi = 4°$, showing the shift of frequency when the trapped energy of the resonator is changed.

FIG. 12 is a graphic view of the temperature characteristic with respect to various amounts of trapped energy $\zeta$, in the case of $\theta=0°$ and $\phi=4°$. The graph of $\zeta=1.06$ is the most desirable since the turning point is about normal room temperature and the variation of frequency with respect to the change of the temperature is minimized. Graph $F_Z$ in FIG. 13 represents the relationship between $\zeta$ and $\phi$ for obtaining the temperature characteristic in which the nadir temperature is equal to normal room temperature. The condition of single mode oscillation of the resonance chip of normal frequency is $\zeta<1.25$. Therefore, $l/H<3.95$ is derived from the aforementioned formula (a). The curve $F_Z$ is below G when $\phi$ is less than about 6°, i.e., the rotational angle about the Z-axis is within the range of $-6°$ to 6°. The graphs of FIG. 9 can be applied to $\theta$ of below zero by symmetrically rotating the graphs with respect to the point $\theta=0$ and $\phi=0$. The data repesented in these graphs indicte that with a $\zeta$ for obtaining single mode resonance, $\theta$ and $\zeta$ should be within $\pm 10°$.

Figure 14:
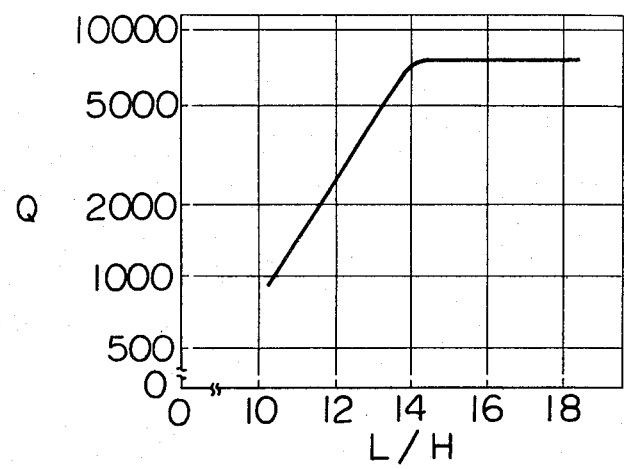
FIG. 14 is a graphic view of the relationship between the dimension ratio (L/H) of the resonator and the quality factor Q.

FIG. 14 is a graphic view of experimental results of the quality factor Q with respect to L/H, in which L is the length and H is the thickness of the resonance chip in lithium tantalate of FIG. 2. In FIG. 14, the abscissa represents L/H and the ordinate represents Q. The graph represents the relationship between Q and L/H. Q is constant in the region of L/H>14 but falls in the region of L/H<14. Therefore, it is desirable that L/H be larger than 14 so as to obtain resonance chips of stable and high quality.

Figure 15:
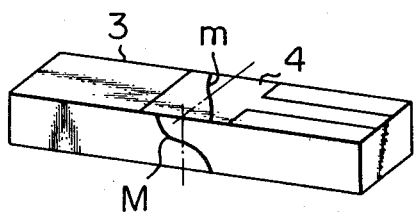
FIG. 15 is a view for explaining modes of oscillation of the resonance chip.
Figure 16:
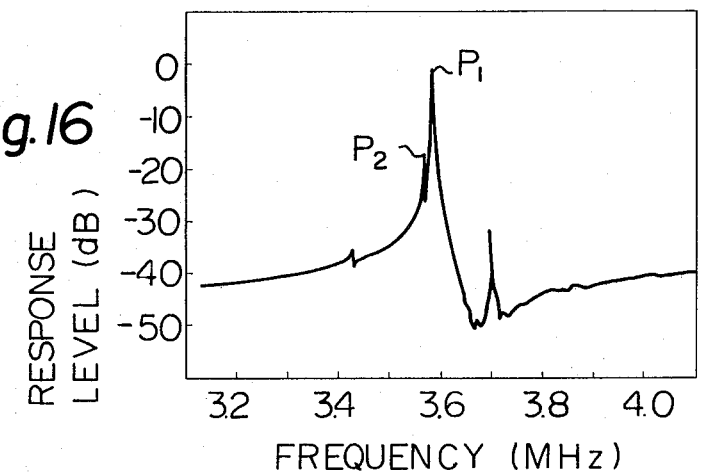
FIG. 16 is a graphic view of the frequency characteristic of a resonator in the prior art.
Figure 17:
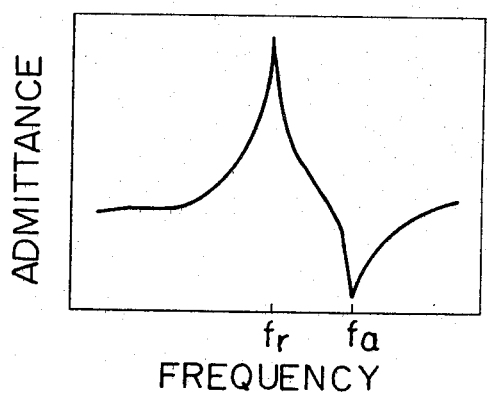
FIG. 17 is a graphic view of the admittance characteristic of the resonator.

FIG. 15 is a perspective view of the resonance chip 3 in lithium tantalate of FIG. 2 for explaining the oscillation modes of the resonance chip 3. FIG. 16 is a graphic view of the frequency characteristic of the resonance chip 3. FIG. 17 is a graphic view of the admittance characteristic of the resonance chip 3.

As illustrated in FIG. 15, when a prescribed electric field is applied between the upper electrode 4 and the lower electrode (not shown) of the resonance chip 3, thickness shear mode oscillation M which is used as primary oscillation of the resonance chip 3, and width shear mode oscillation m, which affects the frequency characteristic, are generated. The frequency of the resonance of width shear mode oscillation m depends upon the width W of the resonance chip 3 and decreases as the width W increases.

In FIG. 16, the abscissa represents frequency (MHz) and the ordinate represents response level (dB). The graph represents the frequency characteristic of the resonance chip 3. The peak $P_1$ of the graph corresponds to the resonance of the thickness shear mode oscillation M. The peak $P_2$ is a spurious response which is generated when the width shear mode oscillation m interferes with the thickness shear mode oscillation M. If the frequency of this spurious response is near that of the peak $P_1$, the characteristic of the resonance chip 3 is degraded.

In FIG. 17, the abscissa represents the frequency f and the ordinate represents the admittance. The graph represents the adimittance characteristic of the resonance chip 3. Point fr on the abscissa designates the frequency of the resonance and point fa designates the frequency of the antiresonance. The frequency of the resonance of the resonance chip 3 is unstable if the spurious response is generated near the frequency point of fr. Therefore, the spurious responses should be sufficiently far away from the point fr.

Figure 18:
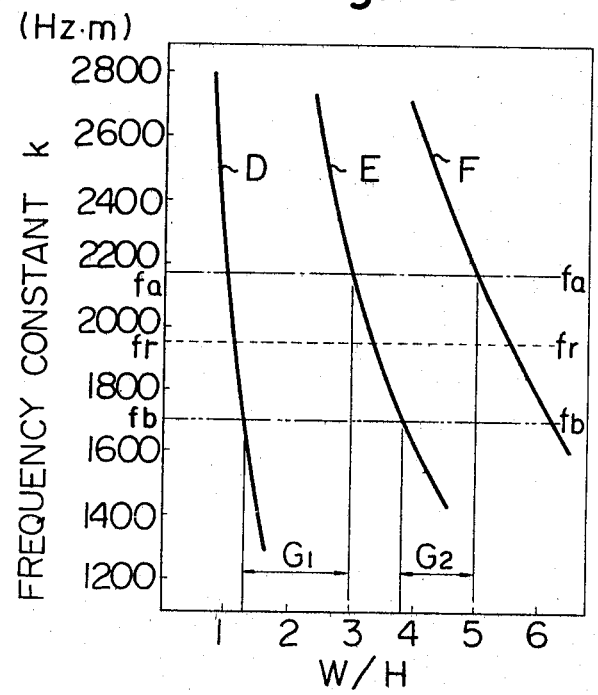
FIG. 18 is a graphic view of a frequency constant k in which spurious response is generated with respect to the dimensions ratio (W/H) of the resonance chip.

FIG. 18 is a graphic view of experimental results of the constant k (Hz·m) of frequency in which spurious response is generated due to width shear mode oscillation, with respect to the ratio W/H. In FIG. 18, the abscissa represents W/H and the ordinate represents k. Curves D, E, and F represent the relationship between k and W/H with respect to the first, third, and fifth width shear mode, respectively, in which spurious responses are generated. The dotted line fr represents k of resonance. The dash-dot line fa represents antiresonance. The dash-two dot line fb represents the minimum k for avoiding adverse influence from the spurious response. As can be seen from FIG. 18, a first region $G_1$ of W/H between about 1.35 and 3, and a second region $G_2$ of W/H between about 3.8 and 5 are free from adverse influence of spurious response.

Figure 19:
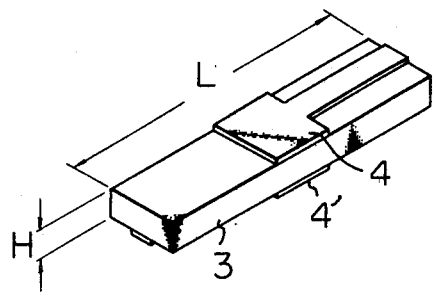
FIG. 19 is a perspective view for explaining the dimension of the resonance chip.
Figure 20:
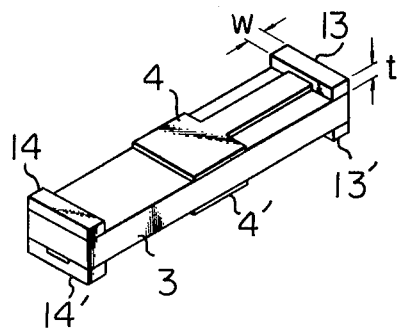
FIG. 20 is a perspective view of the resonance chip providing with terminal conductors.
Figure 21:
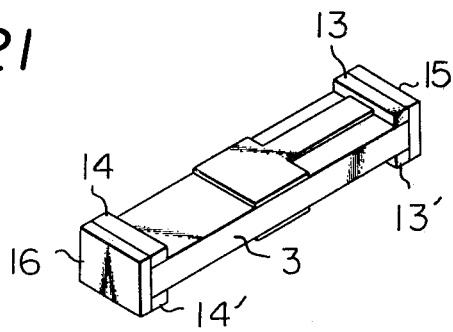
FIG. 21 is a perspective view of the resonance chp provided with connecting conductors.
Figure 22:
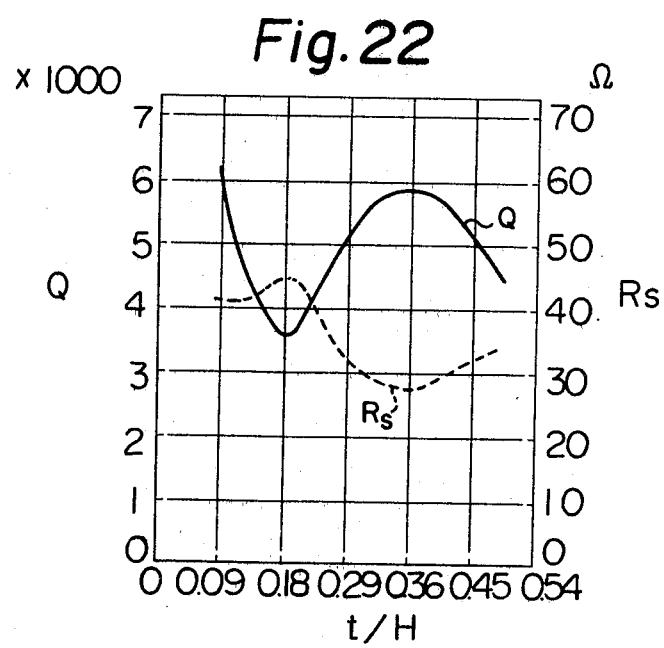
FIG. 22 is a graphic view of the quality factor Q and the equivalent series resistance $R_S$ with respect to the ratio (t/H), in which t is the thickness of the terminal member and H is the thickness of the chip plate.
Figure 23:
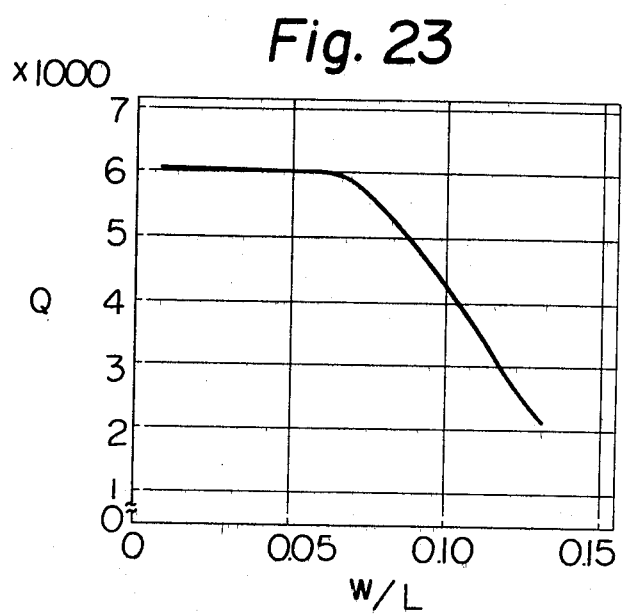
FIG. 23 is a graphic view of the quality factor Q with respect to the ratio (w/L), in which w is the width of the terminal member and L is the length of the chip plate.
Figure 24:
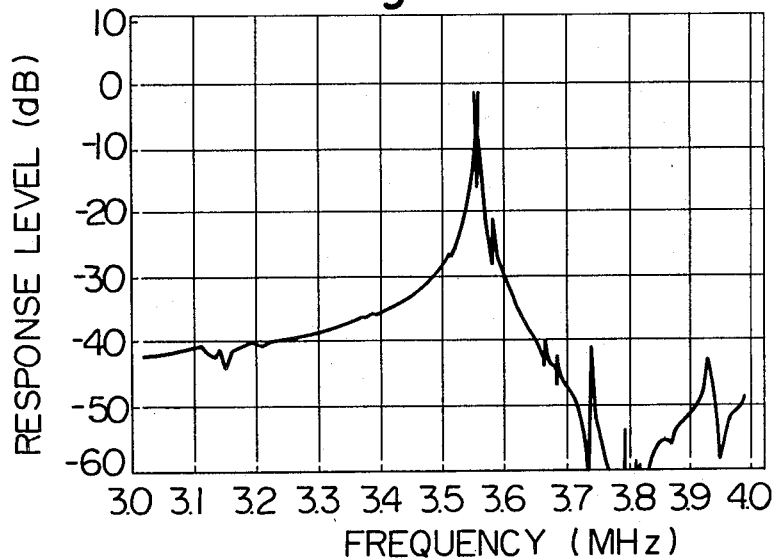
FIG. 24 is a graphic view of the frequency characteristic of the resonator of t/H=0.1.
Figure 25:
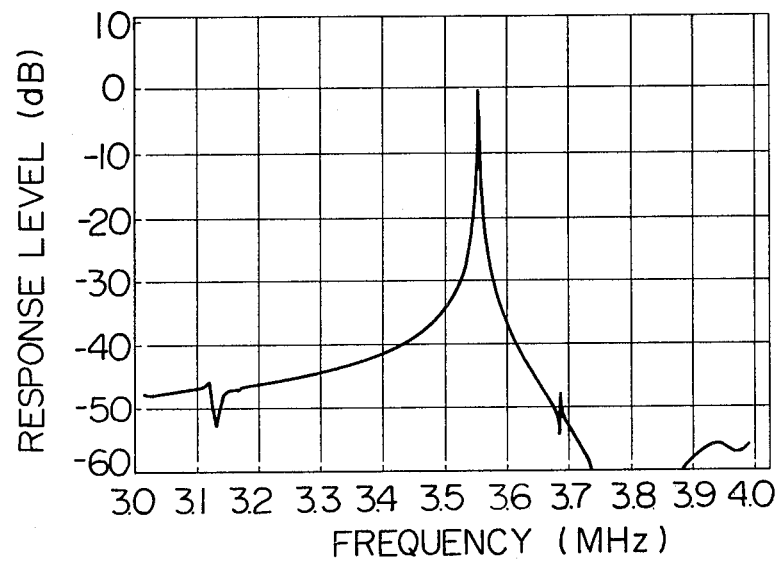
FIG. 25 is a graphic view of the frequency characteristic of the resonator of t/H=0.36.

FIGS. 19 to 21 are views for explaining the construction of the resonance chip 3 according to the present invention. FIG. 22 is a graphic view of experimental results of the quality factor Q and the equivalent series resistance $R_S$ with respect to the thickness ratio t/H, which backs up the present invention. FIG. 23 is a graphic view of experimental results of the quality factor Q with respect to width ratio w/L, which also backs up the present invention. FIG. 24 is a graphic view of the frequency characteristics of the resonance chip 3 in which the thickness ratio t/H is 0.1. FIG. 25 is a graphic view of the frequency characteristic of the resonance chip 3 in which the thickness ratio t/H is 0.36.

In FIG. 19, a strip shaped resonance chip 3 of lithium tantalate which has a rectangular cross-section is illustrated. The length and the thickness of the resonance chip 3 are represented by L and H, respectively. T shaped electrode patterns 4 and 4' are formed by the evaporation method on the upper and lower surfaces of the resonance chip 3.

After that, as illustrated in FIG. 20, two pairs of terminal conductors 13 and 13' and 14 and 14' are formed on both ends of the resonance chip 3 by the printing method. The terminal conductor 13 is superposed on the end of the electrode 4. The terminal conductor 14' is superposed on the end of the electrode 4'.

After that each pair of terminal conductors 13 and 13' and 14 and 14' is connected by a connecting conductor 15 and, respectively so as to form a resonance chip assembly, as illustrated in FIG. 21.

The terminal conductors 13, 13', 14 and 14' are printed by using conductive paste such as silver paste. The thickness t and the width w of each terminal conductor 13, 13', 14 and 14' are determined on the basis of experimental results, described later, so that the thickness ratio t/H is about 0.27 to 0.43 and the width ratio w/L is smaller than 0.06. The resonance chip assembly in FIG. 21 is mounted on a base (not shown) of a resonator package (not shown). A lead wire of the resonator package is connected to each of the electrodes 4 and 4' through the terminal conductors 13, 13', 14, 14' and the connecting conductors 15 and 16. The connection between the lead wire and the connecting conductors 15 and 16 is achieved simultaneously with the forming process of the connecting conductors 15 and 16 by the printing method. Assembly of the resonator package is completed by covering the base by a cap (not shown).

In FIG. 22, the abscissa represents the thickness ratio t/H of the terminal conductor. The left ordinate represents the quality factor Q. The right ordinate represents the equivalent series resistance $R_S$. Curves Q and $R_S$ represent the relationship between t/H and Q and the relationship between t/H and $R_S$, respectively. Both graphs are based on experimental data. The resonance chip of lithium tantalate used in the experiment had a length L of 8 mm, a width of 1.6 mm,. a thickness H of 0.55 mm, and a width ratio w/L of 0.05. In FIG. 22, as can be seen from curve Q of the characteristic of Q, the value of Q is minimized when the thickness ratio t/H is 0.18, in which the value of Q is about 3,750. The desirable value of Q is larger than 5,000. Therefore, the thickness ratio t/H should be less than 0.11 or between 0.27 and 0.46. The resonance resistance $R_S$ is maximum (45 Ω) when the thickness ratio t/H is 0.18. The desirable value of $R_S$ is below 30 Ω. Therefore, the thickness ratio t/H should be 0.29 to 0.42. In order to simultaneously satisfy the desirable conditions with respect to the quality factor Q and the equivalent series resistance $R_S$, the desirable range of the thickness ratio t/H is between 0.29 and 0.42.

In FIG. 23, the abscissa represents the width ratio w/L and the ordinate represents the quality coefficient Q. The graph in FIG. 23 represents experimental results of the relationship between w/L and Q. As can be seen from FIG. 23, the value of Q is constant (about 6,000) when the width ratio w/L is below 0.06 and decreases when the width ratio w/L exceeds 0.06. Therefore, the width ratio w/L should be below 0.06 in order to obtain a desirable value of Q.

In FIG. 24, the abscissa represents the frequency (MHz) and the ordinate represents the response lever (dB). The graph represents the frequency characteristic of the resonance chip in which the thickness ratio t/H is 0.1, which is out of the aforementioned desirable range, i.e., between 0.29 to 0.42. As can be seen from this graph, spurious response is generated in the critical region of the frequency.

In FIG. 25, the abscissa and the ordinate represent the same parameters as those of FIG. 24. The graph represents the frequency characteristic of the resonance chip in which the thickness ratio t/H is 0.36, which is within the aforementioned desirable range, i.e., between 0.29 and 0.42. Spurious oscillation, seen in FIG. 24, has been eliminated from the critical region of the frequency.

As mentioned above, the desirable angle between the longitudinal direction of the resonance chip according to the present invention and the Y-axis of the crystal has been determined to be −50±2°, so that efficiency of transformation is increased and spurious response is effectively eliminated with the result that the quality of the resonator is upgraded. An optimal temperature characteristic can be obtained without generating spurious response by selecting the trapped energy $\zeta$ in view of the angle rotated about each axis of the crystal.

An optimal ratio of the thickness of the resonance chip to the length thereof and an optimal ratio of the width of the resonator chip to the thickness thereof can be determined, so that a resonator of high reliability and high quality in which spurious response is effectively eliminated can be obtained. Also, optimal dimensions of the terminal conductor formed on each end of the resonance chip plate 3 can be determined, so that it is possible to obtain a resonator of high reliability and high quality in which spurious response is effectively eliminated.

We claim:

1. A piezoelectric resonator which resonates due to thickness shear, comprising:
   a strip-shaped resonance chip, made from an X-cut plate of lithium tantalate crystal having two surfaces, a thickness and a direction of primary oscillation, said resonance chip having a rectangular prism shape with a thickness corresponding to the thickness of the X-cut plate and a width measured perpendicular to the axis of said resonance chip; and
   electrodes, formed on the sides of said resonance chip corresponding to the surfaces of the X-cut plate, said electrodes being centered along the axis of the resonance chip and having a width equal to the width of said resonance chip, the axis of said resonance chip inclining with respect to the Y-axis by an angle of 50°±2° in the clockwise direction, and the axis of said resonance chip coincides with the displacement direction of the primary oscillation mode of the X-cut plate.

2. A piezoelectric resonator as set forth in claim 1, wherein the X-cut plate is rotated about the Y-axis and Z-axis of the lithium tantalate crystal with angles of rotation less than or equal to 10°, and wherein said electrodes have a length which is less than 3.95 times the thickness of said resonance chip.

3. A piezoelectric resonator as set forth in claim 2, wherein the angles of rotation about the Y-axis and Z-axis are selected where the trapped energy of the oscillation in said resonance chip has a primary temperature coefficient of zero.

4. A piezoelectric resonator as set forth in claim 1, wherein the trapped energy $\zeta$ is defined by $$\zeta = \tfrac{1}{8} \cdot \theta + (0.65 \pm 0.1)$$

when the angle of rotation about the Z-axis is zero and the angle of rotation about the Y-axis is $\theta$.

5. A piezoelectric resonator as set forth in claim 2, wherein the angle of rotation about the Y-axis is zero while the angle of rotation about the Z-axis is between −6° and 6°.

6. A piezoelectric resonator as set forth in claim 1, wherein the length of said resonance chip divided by the thickness of said resonance chip is more than 14 and the width of said resonance chip divided by the thickness of said resonance chip is selected from among the ranges 1.35 to 3.0 and 3.8 to 5.0.

7. A piezoelectric resonator as set forth in claim 1, further comprising terminal conductors, operatively connected to said electrodes and connectable to outside wiring, each of said terminal conductors formed on one of the X-plane surfaces at each end of said resonance chip, the thickness of said terminal conductor divided by the thickness of said resonance chip being between 0.29 and 0.42 and the width of said terminal conductor divided by the length of said resonance chip being less that 0.06.

8. A piezoelectric resonator which resonates due to thickness shear, comprising:
   a strip-shaped resonance chip, made from an X-cut plate of lithium tantalate crystal having two surfaces, a thickness and a direction of primary oscillation, said resonance chip having a rectangular prism shape with a thickness corresponding to the thickness of the X-cut plate and a width measured perpendicular to the axis of said resonance chip; and
   electrodes formed on the sides of said resonance chip corresponding to the surfaces of the X-cut plate, said electrode being centered along the axis of said resonance chip and having a width equal to the width of said resonance chip, the axis of said resonance chip inclining with respect to the Y-axis and the axis of said resonance chip coincides with the displacement direction of the primary oscillation mode of the crystal, said X-cut plate being rotated about at least one of the Y-axis and Z-axis within an angle of 10° in one direction, and said electrodes have a length which is less than 3.95 times the thickness of said resonance chip.

9. A piezoelectric resonator as set forth in claim 8, wherein the angles of rotation about the Y-axis and Z-axis are selected where the trapped energy of the oscillation in said resonance chip has a primary temperature coefficient of zero.

10. A piezoelectric resonator as set forth in claim 8, wherein the trapped energy $\zeta$ is defined by $$\zeta = \tfrac{1}{8} \cdot \theta + (0.65 \pm 0.1)$$

when angle of rotation about the Z-axis is zero and the angle of rotation about the Y-axis is $\theta$.

11. A piezoelectric resonator as set forth in claim 8, wherein the angle of rotation about the Y-axis is zero while the angle of rotation about the Z-axis is between −6° and 6°.

* * * * *

UNITED STATES PATENT AND TRADEMARK OFFICE
CERTIFICATE OF CORRECTION

PATENT NO. : 4,454,444
DATED : June 12, 1984
INVENTOR(S) : Fujiwara et al.

It is certified that error appears in the above-identified patent and that said Letters Patent is hereby corrected as shown below:

[56] Other Publications
"Resonatore" should be --Resonator--.

[57] Line 10, "2'" should be --2$^\circ$--.

Col. 1, line 60, "having" should be --has--.

Col. 2, line 56, "mension" should be --mensions--;
line 58, "providing" should be --provided--;
line 59, "chp" should be --chip--.

Col. 3, line 55, delete "resonance";
line 56, before "chip" insert --resonance--.

Col. 4, line 5, delete "resonance";
line 6, before "chip" insert --resonance--;
line 8, delete "fast"; after "the" insert --fast--.
line 24, after "chip" insert --3--;
line 40, "ALso" should be --Also--.

UNITED STATES PATENT AND TRADEMARK OFFICE
CERTIFICATE OF CORRECTION

PATENT NO. : 4,454,444
DATED : June 12, 1984
INVENTOR(S) : Fujiwara et al.

It is certified that error appears in the above-identified patent and that said Letters Patent is hereby corrected as shown below:

Col. 5, line 8, after "irrespective" insert --of--;
after "changes" delete "of";
line 32, " ζ " should be --∅--.

Col. 6, line 40, "repesented" should be --represented--;
line 41, "indicte" should be --indicate--;
line 42, " ζ " should be --∅--;
line 46, "in" should be --of--;
"of" should be --in--.
line 54, "in" should be --of--; "of" should be --in--.

Col. 7, line 14, "adimittance" should be --admittance--;
line 67, "and, respectively" should be --and 16, respectively,--.

UNITED STATES PATENT AND TRADEMARK OFFICE
CERTIFICATE OF CORRECTION

PATENT NO. : 4,454,444  
DATED : June 12, 1984  
INVENTOR(S) : Fujiwara et al.

Page 3 of 3

It is certified that error appears in the above-identified patent and that said Letters Patent is hereby corrected as shown below:

Col. 8, line 11, "14, 14'" should be --14 and 14'--;  
      line 26, "width" should be --width W--.

Col. 9, line 14, "3" should be --3'--.

Col. 10, line 18, "that" should be --than--.

Signed and Sealed this

Twentieth Day of November 1984

[SEAL]

Attest:

GERALD J. MOSSINGHOFF

Attesting Officer

Commissioner of Patents and Trademarks